United States Patent
Hsieh et al.

(10) Patent No.: US 9,029,753 B2
(45) Date of Patent: May 12, 2015

(54) OPTICAL RECOGNITION SYSTEM AND METHOD THEREOF

(71) Applicant: National Tsing Hua University, Hsinchu (TW)

(72) Inventors: Chih-Cheng Hsieh, Hsinchu (TW);
Shang-Fu Yeh, Hsinchu (TW);
Chun-Kai Liu, Hsinchu (TW);
Chiao-Jen Cheng, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 190 days.

(21) Appl. No.: 13/628,667

(22) Filed: Sep. 27, 2012

(65) Prior Publication Data
US 2014/0084136 A1    Mar. 27, 2014

(51) Int. Cl.
*H01L 27/146* (2006.01)
*H04N 5/235* (2006.01)
*H04N 5/355* (2011.01)

(52) U.S. Cl.
CPC ........ *H04N 5/2355* (2013.01); *H01L 27/14609* (2013.01); *H04N 5/35581* (2013.01)

(58) Field of Classification Search
USPC ........................ 250/208.1; 348/302, 294, 311
See application file for complete search history.

(56) References Cited

U.S. PATENT DOCUMENTS

| | | | |
|---|---|---|---|
| 6,707,410 B1 | 3/2004 | Bock | |
| 7,973,840 B2 * | 7/2011 | Kasuga et al. | 348/294 |
| 2013/0242152 A1 * | 9/2013 | Kasai | 348/294 |

FOREIGN PATENT DOCUMENTS

TW    I350104    1/2010

OTHER PUBLICATIONS

Yeh et al., "A Novel Single Slope ADC Design for Wide Dynamic Range CMOS Image Sensors", A Thesis Published Oct. 2011.

* cited by examiner

*Primary Examiner* — Tony Ko
(74) *Attorney, Agent, or Firm* — Mintz Levin Cohn Ferris Glovsky and Popeo, P.C.; Peter F. Corless; Steven M. Jensen

(57) ABSTRACT

The present invention is related to an optical recognition system and a method thereof, and more particularly to an optical recognition system and a method that adopts a single-slope analog-to-digital converter to proceed a single-slope analog-to-digital conversion in order to have an image with a wide dynamic range.

5 Claims, 7 Drawing Sheets

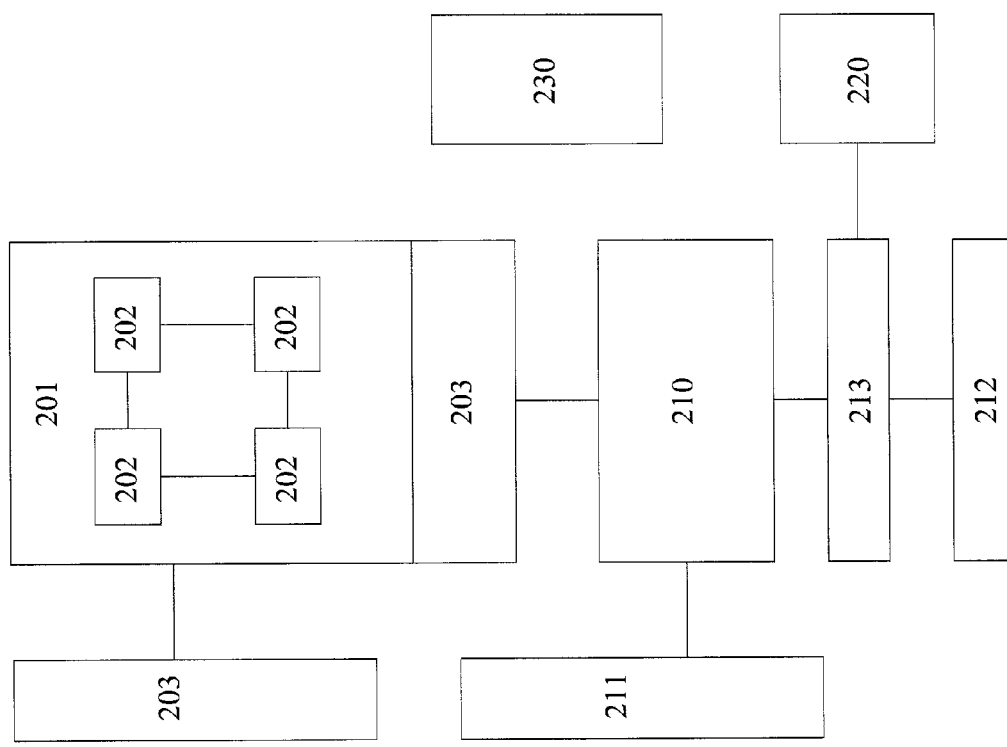

ized values are stored in the separate frame memory 210 independent of the pixel circuitry. Hence, the frame memory 210 is a must for storing information as well, and the prior art, U.S. Pat. No. 6,707,410, is still added with the cost of hardware.

OPTICAL RECOGNITION SYSTEM AND METHOD THEREOF

BACKGROUND OF THE INVENTION

1. Field of the Invention

The present invention relates to optical recognition systems and methods thereof, and, more particularly, to an optical recognition system and a method that adopts a single-slope analog-to-digital converter to proceed a single-slope analog-to-digital conversion in order to have an image with a wide dynamic range.

2. Description of the Prior Art

Please refer to FIG. 6, which illustrates a schematic pixel view of a highly-illuminated area of Taiwanese patent no. I350104, entitled "METHOD, APPARATUS, AND SYSTEM PROVIDING AN IMAGER WITH PIXELS HAVING EXTENDED DYNAMIC RANGE." As shown in FIG. 6, the dynamic range of a pixel is increased by using selective photosensor resets during a frame time of image capture at a timing depending on the light intensity that the pixel will be exposed to during the frame time. Pixels that will be exposed to high light intensity are reset later in the frame than pixels that will be exposed to lower intensity. The method includes the steps of: determining a pixel value that will be exposed in a light intensity during a frame time; using a timing depending on the determined on the light intensity to reset accumulated charges in a photosensor of the pixel during the frame time; transferring the charges in the photosensor to a store area; and generating a pixel image signal based on the charges transferred to the store area.

In another word, the illumination value of every pixel is stored in a memory. Then the pixels with the same illuminations are divided into plural pixel areas, and the dimensions of each pixel area are stored in the memory. As shown in FIG. 6, there are four image fields of illumination areas 1', 2', 3', and 4', and therefore four corresponding pixel sets are generated. Thus, any of the four illumination areas 1', 2', 3', and 4' is constructed by the pixel with the same illumination.

However, aforesaid prior art discloses that of using the timing depending on the pixel exposed in the light intensity during the frame time to reset the photosensor, presenting the four illumination areas for sensing, and the information of each illumination area being stored in the register (memory). Since the additional memory is a must for storing information, the cost of hardware is increased.

Please refer to FIG. 7, which illustrates a schematic system of U.S. Pat. No. 6,707,410, entitled "DIGITAL PIXEL SENSOR WITH A DYNAMIC COMPARATOR HAVING REDUCED THRESHOLD VOLTAGE SENSITIVITY." The digital pixel sensor architecture 200 has a frame memory 210, and incorporates a new comparator and divides the analog-to-digital conversion circuitry between each pixel and a column processing circuit of the pixel array. The digital conversions are performed one row at a time, instead of for the entire array at once. The row-by-row digitization does not degrade the speed of the DPS architecture since the speed of an imaging system is typically limited by a chip's off-chip data output rate. The row-by-row digitization is also advantageous. The digitized values are stored in the separate frame memory 210 independent of the pixel circuitry. Hence, the frame memory 210 is a must for storing information as well, and the prior art, U.S. Pat. No. 6,707,410, is still added with the cost of hardware.

Thus, how to design an optical recognition system and a method thereof for effectively accessing information, being without additional memory to speed up access, degrading consumption of power, and the dimensions of a chip shall be an important issue for the skilled people.

SUMMARY OF THE INVENTION

An objective of the present invention is to provide an optical recognition system and a method thereof. The system improves the time period of exposure, that is, a threshold voltage is applied to determine a long exposure or a short exposure in order to finish exposure in a time period and not have an additional register for storing exposure information, so that the one-time exposure extends the application scope thereof.

Another objective of the present invention is to provide the optical recognition system and the method thereof. The present invention adopts a digital-to-analog converter to proceed one-time exposure so as to improve the speed of hardware and lower the consumption of power.

The present invention provides an optical recognition method, comprising the steps of: (1) starting; (2) proceeding a long exposure and a short exposure, and producing a long exposure signal and a short exposure signal, respectively; (3) reading out the short exposure signal; (4) comparing the short exposure signal with a threshold voltage $V_{Th}$, and going to step (5) if the short exposure signal is greater than the threshold voltage $V_{Th}$, otherwise, going to step (7); (5) defining the short exposure signal as a highly-illuminated pixel (HIP); (6) using a single-slope analog-to-digital converter (SSADC) to digitize the highly-illuminated pixel, then going to step (9); (7) reading out the long exposure signal; (8) using the SSADC to digitize the long exposure signal; (9) producing an image and processing the image; and (10) ending.

The present invention further provides an optical recognition system, comprising: a pinned photodiode (PD); a floating diffusion (FD); a charge transfer transistor (Mt); a reset transistor (Mr); a source follower transistor (Msf); a pixel select transistor (Mse), having a capacitance that is a parasitic capacitance of the floating diffusion; a plurality of voltage signals; a plurality of nodes; and a single-slope analog-to-digital converter (SSADC), having a pre-amplifier; a comparator; a plurality of DC blocking capacitors; a plurality of switch transistors; a switch control block; a plurality of latches Latch 1 and Latch 2; and two reference voltages.

Other and further features, advantages, and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits, and advantages of the preferred embodiments of the present invention will be readily understood by the accompanying drawings and detailed descriptions, wherein:

" and FIG. 7 illustrates a schematic system of U.S. Pat. No. 6,707,410, entitled "DIGITAL PIXEL SENSOR WITH A DYNAMIC COMPARATOR HAVING REDUCED THRESHOLD VOLTAGE SENSITIVITY."

DETAILED DESCRIPTION OF THE INVENTION

Following preferred embodiments and figures will be described in detail so as to achieve aforesaid objects.

Figure 1:
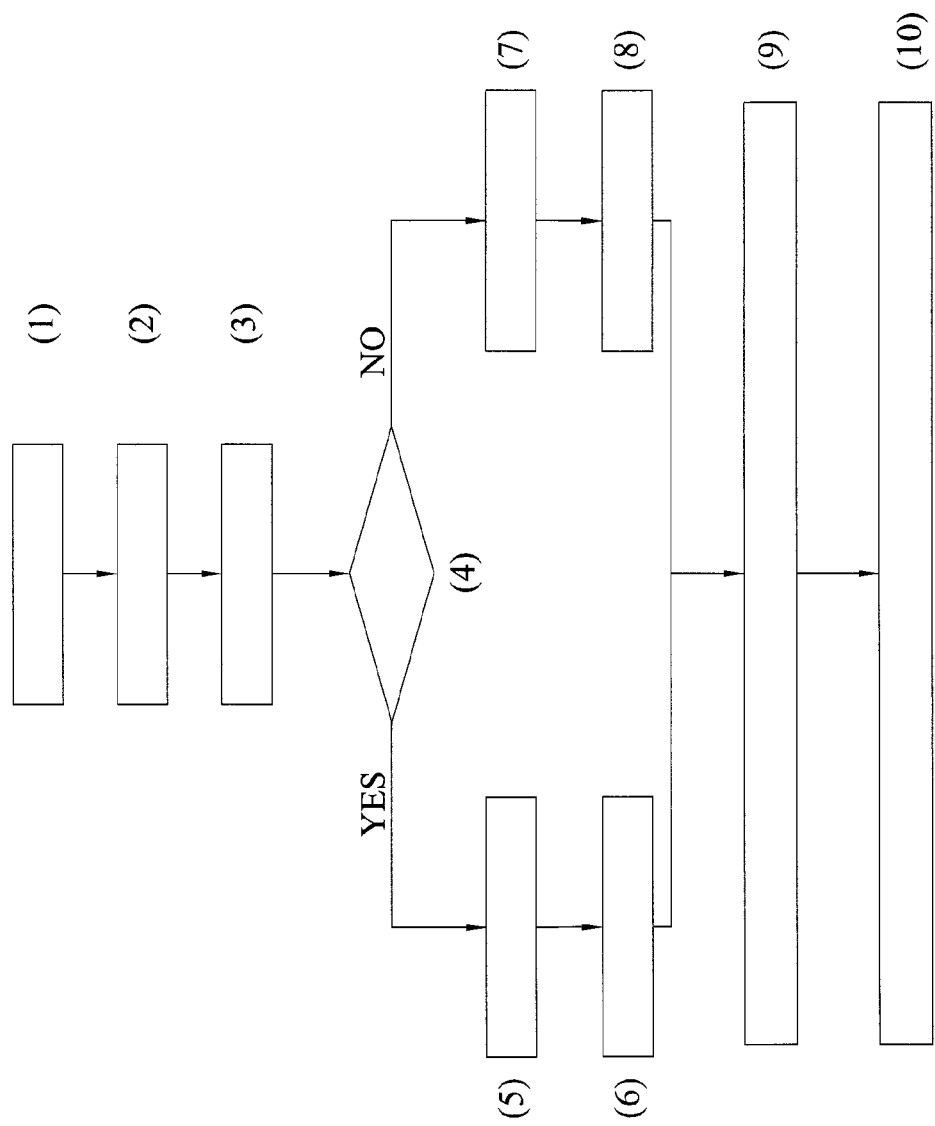
FIG. 1 illustrates a flow chart of a preferred embodiment of an optical recognition method according to the present invention.

With reference to FIG. 1, which illustrates a flow chart of a preferred embodiment of an optical recognition method according to the present invention. The method includes the steps of: (1) starting; (2) proceeding a long exposure and a short exposure, and producing a long exposure signal and a short exposure signal, respectively; (3) reading out the short exposure signal; (4) comparing the short exposure signal with a threshold voltage $V_{Th}$, the $V_{Th}$ being defined as a minimum value for the short exposure signal, and going to step (5) if the short exposure signal is greater than the threshold voltage $V_{Th}$, otherwise, going to step (7); (5) defining the short exposure signal as a highly-illuminated pixel (HIP); (6) using a single-slope analog-to-digital converter (SSADC) to digitize the highly-illuminated pixel, then going to step (9); (7) reading out the long exposure signal; (8) using the SSADC to digitize the long exposure signal; (9) producing an image and processing the image based on the following equation:

$$I_O = D_{INDEX}*(V_{SAT}+I_H)+\overline{D_{INDEX}}*I_L,$$

wherein $I_O$ is a synthesized output signal, $D_{INDEX}$ is an HIP/LIP detection result, $I_H$ is a short exposure signal, $I_L$ is a long exposure signal, and $V_{SAT}$ is the saturation voltage of a sensor; and (10) ending.

Figure 2:
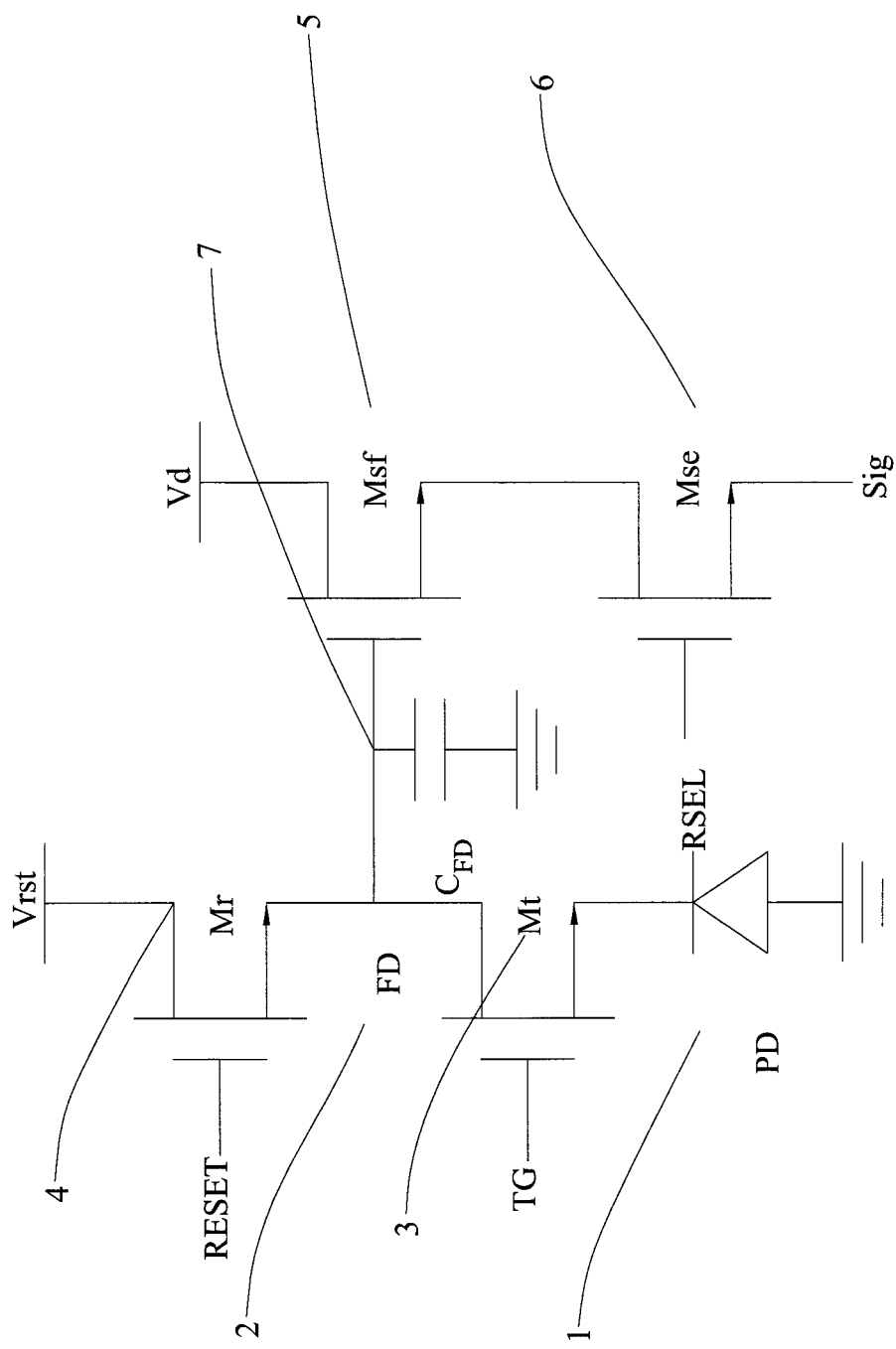
FIG. 2 and FIG. 3 illustrate schematic views of a preferred embodiment of circuits of an optical recognition system according to the present invention.
Figure 3:
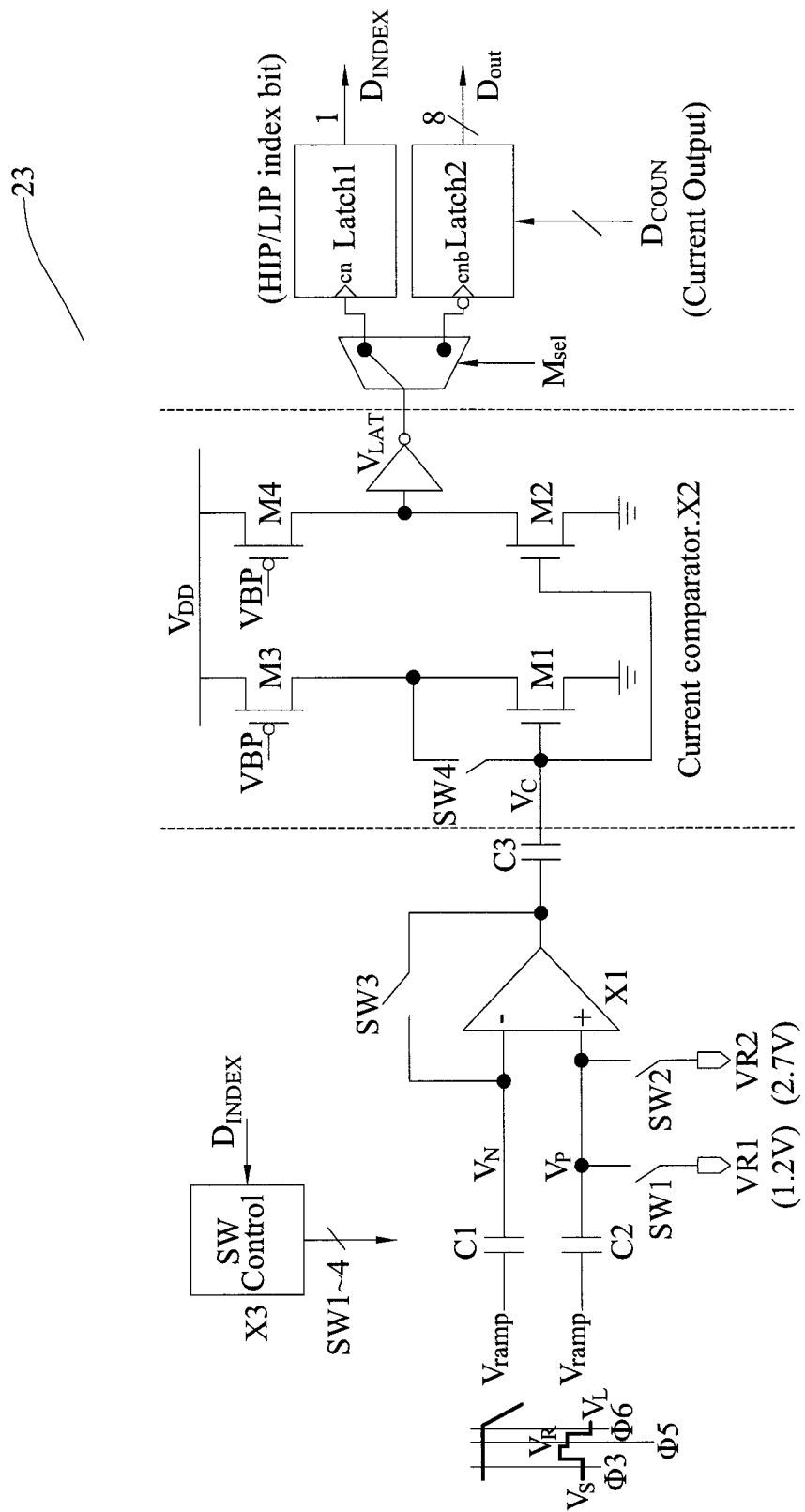

With references to FIG. 2 and FIG. 3, which illustrate schematic views of a preferred embodiment of circuits of the optical recognition system of the present invention. The optical recognition system includes: a pinned photodiode (PD) 1; a floating diffusion (PD) 2; a charge transfer transistor (Mt) 3; a reset transistor (Mr) 4; a source follower transistor (Msf) 5; a pixel select transistor (Mse) 6, having a capacitance ($C_{FD}$) 7 that is a parasitic capacitance of the floating diffusion 2; a plurality of voltage signals $V_S$, $V_L$ and $V_R$; a plurality of nodes $V_N$, $V_P$ and $V_C$; and a single-slope analog-to-digital converter (SSADC), having a pre-amplifier X1; a comparator X2; a plurality of DC blocking capacitors C1, C2 and C3; a plurality of switch transistors SW1, SW2, SW3, and SW4; a switch control block X3; a plurality of latches Latch 1 and Latch 2; and two reference voltages $V_{R1}$ and $V_{R2}$; wherein the short exposure signal is calculated by means of the saturated capacity of the pinned photodiode (PD) 1, excess charges overflowing to the floating diffusion (PD) 2 so as to turn on the reset transistor (Mr) 4 for long exposure and accumulate charges, the charge transfer transistor (Mt) 3 providing a suitable path to accommodate saturated charges so as to let the floating diffusion (FD) 2 start to accumulate charges and turn off the reset transistor (Mr) 4 for long exposure and accumulating charges, the floating diffusion (FD) 2 outputting the accumulated charges to the signal Vs and turning on the reset transistor (Mr) 4 for reading out the short exposure signal, the floating diffusion (FD) 2 again resetting the value of the short exposure signal and outputting the reset value to the signal Vs in order to compare the short exposure signal with the threshold voltage $V_{TH}$, and then determining that the short exposure signal is a highly-illuminated pixel (HIP), the floating diffusion (FD) 2 resetting in order to turn on the charge transfer transistor (Mt) 3, the accumulated charges being transferred from the pinned photodiode (PD) 1 to the floating diffusion (FD) 2 for outputting the charges to the signal $V_L$, then proceeding a single-slope analog-to-digital conversion by means of the single-slope analog-to-digital converter (SSADC) 23 and digitizing the HIP, further, the long exposure signal being calculated by means of the accumulated charges of the pinned photodiode (PD) 1, and a short exposure being proceeded as well for accumulating charges, the floating diffusion (FD) 2 resetting in order to output the accumulated charges to the signal $V_S$ and turning on the reset transistor (Mr) 4 for reading out the short exposure signal, the floating diffusion (FD) 2 resetting the value of the short exposure signal and outputting the reset value to the signal, the charge transfer transistor (Mt) 3 being thus turned on in order to reset the floating diffusion (FD) 2 and read out information to the signal $V_R$, the accumulated charges being from the pinned photodiode (PD) 1 to the floating diffusion (FD) 2, then the short exposure signal being compared with the threshold voltage, so that a lowly-illuminated pixel (LIP) is determined, the charges being output to the signal $V_L$ in order to proceed the single-slope analog-to-digital conversion via the SSADC 23 and digitize the HIP, while the single-slope analog-to-digital conversion is in calculation and the short exposure signal is read out, the offset voltages of the pre-amplifier X1 and the comparator X2 being sampled on the nodes $V_N$ and $V_P$, and the switch transistors SW1, SW3 and SW4 being turned on, the short exposure signal being read out and compared with the threshold voltage $V_{TH}$, the switch transistors SW1 and SW4 being turned off, the floating diffusion (FD) 2 being reset to the signal $V_R$, thus a comparison output lets the latch 1 generates indexes and corresponding control signals, while the short exposure signal is compared with the threshold voltage $V_{TH}$, the comparator X2 outputting logic high, the switch transistor SW3 being turned off and the switch transistor SW4 being turned on, the comparator X2 being reset again to re-sample the offset voltage on the node $V_C$, the latch 2 outputting information while a short exposure digital-to-analog conversion is being proceeded, the comparator X2 outputting logic low while the short exposure signal is compared with the threshold signal $V_{TH}$, the comparator X2 then resetting and re-sampling the offset voltage, the latch 2 outputting information while a long exposure digital-to-analog conversion is being proceeded, wherein the signal of the HIP is moved to the floating diffusion first for store, and the signal of the LIP is stored by the pinned photodiode, the source follower transistor (Msf) proceeds the single-slope analog-to-digital conversion for long exposure or short exposure, the pixel select transistor (Mse) selects one of the signals $V_S$, $V_L$ and $Y_R$ for outputting.

Figure 4:
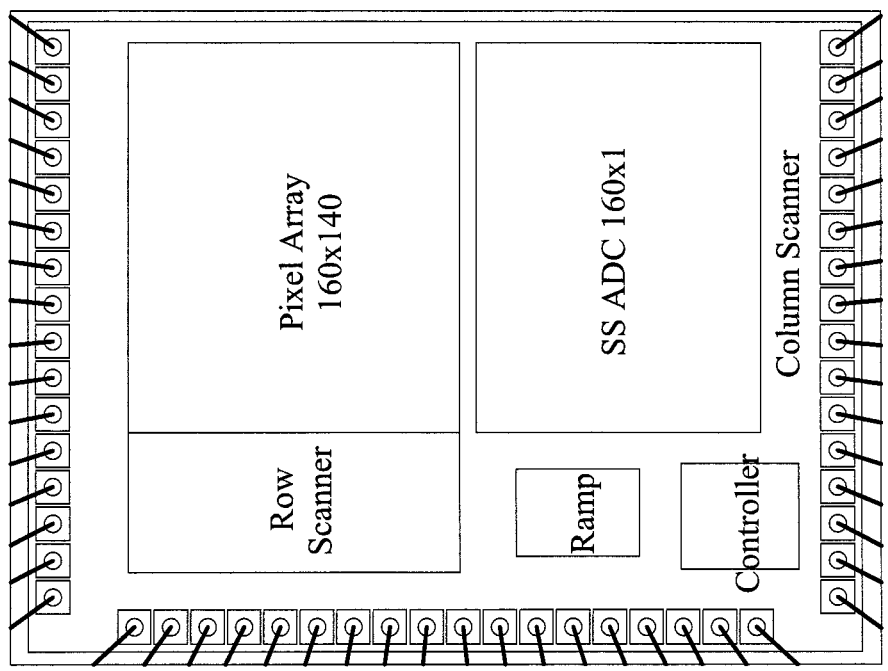
FIG. 4 illustrates a view of specifications of a chip of the optical recognition system according to the present invention.

With reference to FIG. 4, which illustrates a view of specifications of a chip of the optical recognition system according to the present invention. The specifications of the chip are as following: 0.18 μm 1P4M CIS of process technology, 2×1.5 mm² of die size, 5.6×5.6 μm² of pixel size, 160 (H)×140 (V) of array format, 38% of fill factor, 5.33 V/lx-s of sensitivity, 51 dB of DR without extension, 91 dB of DR with extension, 60 frames/s of frame rate, 8 bits of ADC resolution, (+0.16, −0.24)/(+0.28, −0.52) of column-wise single-slope ADC DNL/INL, 0.16% of column FPN (@digital code=125), 3.3V of power supply, 6.4 mW (@60 fps) of power consumption.

Figure 5:
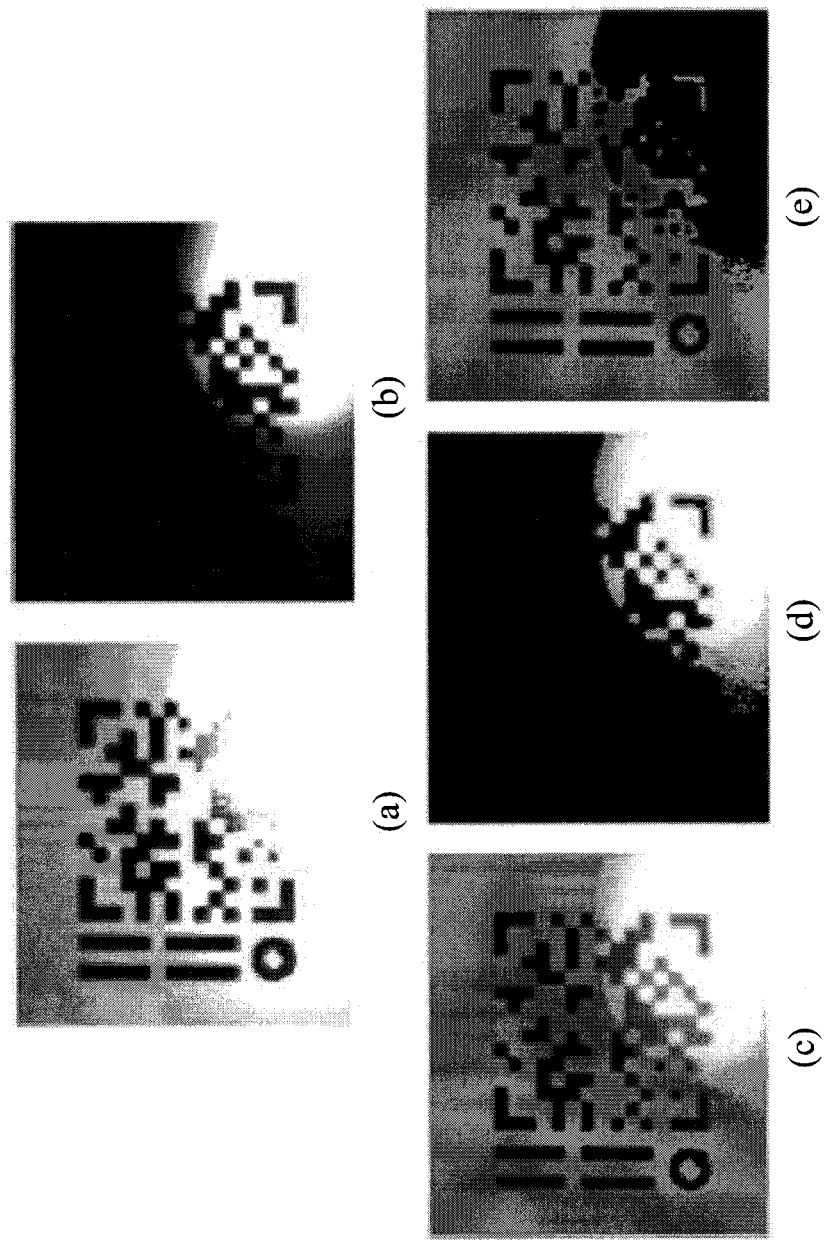
FIG. 5a to FIG. 5e illustrate plural exposed views of plural quick code images of the optical recognition system according to the present invention.
Figure 6:
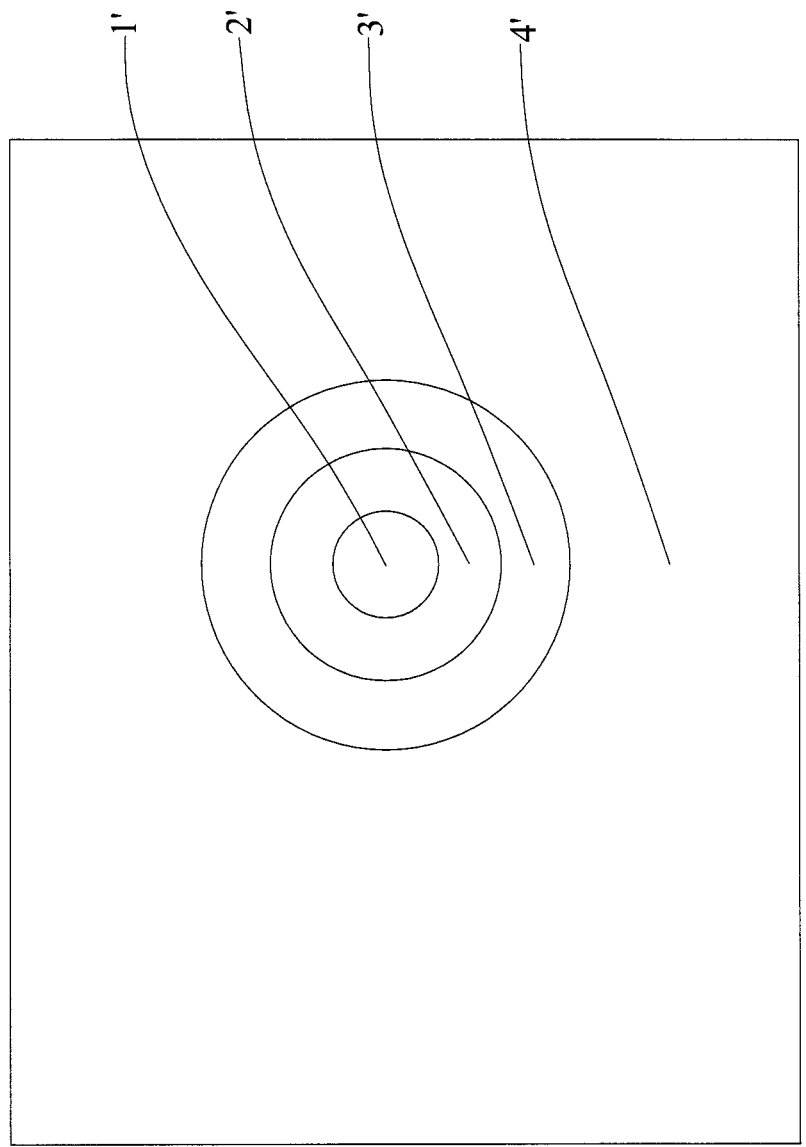
FIG. 6 illustrates a schematic pixel view of a highly-illuminated area of Taiwanese patent no. I350104, entitled "METHOD, APPARATUS, AND SYSTEM PROVIDING AN IMAGER WITH PIXELS HAVING EXTENDED DYNAMIC RANGE.

With references to FIG. 5a to FIG. 5e, which illustrate plural exposed views of plural quick code images of the optical recognition system according to the present invention. FIG. 5a presents a long exposure image. FIG. 5b presents a short exposure image. FIG. 5c presents a synthesized wide DR image using SSADC. FIG. 5d presents an HIP image. FIG. 5e presents an LIP image. Hence, FIG. 5c is obviously clearer than other images. That is, the present invention is full of non-obviousness.

Although the invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. An optical recognition method, comprising the steps of:
   (1) starting the optical recognition;
   (2) proceeding a long exposure and a short exposure, and producing a long exposure signal and a short exposure signal, respectively;
   (3) reading out the short exposure signal;
   (4) comparing the short exposure signal with a threshold voltage $V_{Th}$, and going to step (5) if the short exposure signal is greater than the threshold voltage $V_{Th}$, otherwise, going to step (7);
   (5) defining the short exposure signal as a highly-illuminated pixel;
   (6) using a single-slope analog-to-digital converter to digitize the highly-illuminated pixel, then going to step (9);
   (7) reading out the long exposure signal;
   (8) using the single-slope analog-to-digital converter to digitize the long exposure signal;
   (9) producing an image and processing the image; and
   (10) ending the optical recognition,
   wherein in step (9), the image is processed based on the following equation:

$$I_O = D_{INDEX} * (V_{SAT} + I_H) + \overline{D_{INDEX}} * I_L,$$

wherein $I_O$ is a synthesized output signal, $D_{INDEX}$ is a highly illuminated pixel (HIP)/lowly illuminated pixel (LIP) detection result, $I_H$ is the short exposure signal, $I_L$ is the long exposure signal, and $V_{SAT}$ is a saturation voltage of a sensor.

2. The optical recognition method of claim 1, wherein in step (4), the threshold voltage $V_{Th}$ is defined as a minimum value for the short exposure signal.

3. An optical recognition system comprising:
   a pinned photodiode (PD);
   a floating diffusion (FD);
   a charge transfer transistor (Mt);
   a reset transistor (Mr);
   a source follower transistor (Msf);
   a pixel select transistor (Mse), having a capacitance that is a parasitic capacitance of the floating diffusion;
   a plurality of voltage signals;
   a plurality of nodes; and
   a single-slope analog-to-digital converter (SSADC), including:
      a pre-amplifier;
      a comparator;
      a plurality of DC blocking capacitors;
      a plurality of switch transistors;
      a switch control block;
      a plurality of latches (Latch 1 and Latch 2); and
      two reference voltages;
   wherein a short exposure signal is calculated by means of a saturated capacity of the pinned photodiode (PD),
   excess charges overflowing to the floating diffusion (FD) so as to turn on the reset transistor (Mr) and accumulate charges,
   the charge transfer transistor (Mt) providing a suitable path to accommodate saturated charges so as for the floating diffusion (FD) to start to accumulate charges and turn off the reset transistor (Mr) for a long exposure and accumulating charges,
   the floating diffusion (FD) outputting the accumulated charges to one of the signals and turning on the reset transistor (Mr) for reading out the short exposure signal,
   the floating diffusion (FD) resetting a value of the short exposure signal and outputting the reset value to the signal in order to compare the short exposure signal with a threshold voltage, and determining that the short exposure signal is a highly-illuminated pixel (HIP),
   the floating diffusion (FD) resetting in order to turn on the charge transfer transistor (Mt),
   the accumulated charges being transferred from the pinned photodiode (PD) to the floating diffusion (FD) for outputting the charges to one of the signals,
   proceeding a single-slope analog-to-digital conversion by means of the single-slope analog-to-digital converter (SSADC) and digitizing the HIP,
   the long exposure signal being calculated by means of the accumulated charges of the pinned photodiode (PD), and
   the short exposure being proceeded for accumulating charges,
   the floating diffusion (FD) resetting in order to output the accumulated charges to one of the signals and turning on the reset transistor (Mr) for reading out the short exposure signal,
   the floating diffusion (FD) resetting the value of the short exposure signal and outputting the reset value to the signal,
   the charge transfer transistor (Mt) being turned on in order to reset the floating diffusion (FD) and read out information to one of the signals,
   the accumulated charges being transferred from the pinned photodiode (PD) to the floating diffusion (FD),
   the short exposure signal being compared with the threshold voltage, so that a lowly-illuminated pixel (LIP) is determined,
   the charges being output to one of the signals in order to proceed the single-slope analog-to-digital conversion via the SSADC and digitize the HIP,
   while the single-slope analog-to-digital conversion is in calculation and the short exposure signal is read out, offset voltages of the pre-amplifier and the comparator being sampled on the nodes, the switch transistors being turned on, the short exposure signal being read out and compared with the threshold voltage, the switch transistors being turned off, the floating diffusion (FD) being reset to one of the signals, such that a comparison output lets one of the latches generate indexes and corresponding control signals,
   while the short exposure signal is compared with the threshold voltage, the comparator outputting logic high,
   one of the switch transistors being turned off and the other switch transistors being turned on,
   the comparator being reset to re-sample the offset voltage on one of the nodes, one of the latches outputting information while a short exposure digital-to-analog conversion is being proceeded, the comparator outputting logic low while the short exposure signal is compared with the threshold signal, the comparator resetting and re-sampling the offset voltage, one of the latches outputting information while a long exposure digital-to-analog conversion is being proceeded, the source follower transistor (Msf) proceeding the single-slope analog-to-digital conversion for a long exposure or a short exposure, and the pixel select transistor (Mse) selecting one of the signals for outputting.

4. The optical recognition system of claim 3, wherein the signal of the HIP is moved to the floating diffusion for storage, and the signal of the LIP is stored by the pinned photodiode.

5. The optical recognition system of claim 3, wherein specifications of a chip are:

0.18 µm 1P4M CIS of process technology,

2×1.5 mm$^2$ of die size, 5.6×5.6 µm$^2$ of pixel size, 160 (H)×140 (V) of array format, 38% of fill factor, 5.33 V/lx-s of sensitivity, 51 dB of DR without extension, 91 dB of DR with extension, 60 frames/s of frame rate, 8 bits of ADC resolution, (+0.16, −0.24)/(+0.28,−0.52) of column-wise single-slope ADC DNL/INL, 0.16% of column FPN at digital code=125, 3.3V of power supply, and 6.4 mW of power consumption at 60 fps.

\* \* \* \* \*